United States Patent [19]
Strongin et al.

[11] Patent Number: 5,306,530
[45] Date of Patent: Apr. 26, 1994

[54] METHOD FOR PRODUCING HIGH QUALITY THIN LAYER FILMS ON SUBSTRATES

[75] Inventors: Myron Strongin, Center Moriches; Mark Ruckman, Middle Island; Daniel Strongin, Port Jefferson, all of N.Y.

[73] Assignee: Associated Universities, Inc., Washington, D.C.

[21] Appl. No.: 980,496

[22] Filed: Nov. 23, 1992

[51] Int. Cl.⁵ ............................................. B05D 3/06
[52] U.S. Cl. .................... 427/533; 427/255.2; 427/255.3; 427/294; 427/551; 427/554; 427/582; 427/585; 427/586; 427/596; 427/597
[58] Field of Search ............... 427/533, 551, 554, 582, 427/585, 586, 596, 597, 255.2, 255.3, 294

[56] References Cited
U.S. PATENT DOCUMENTS

| | | | |
|---|---|---|---|
| 3,139,362 | 6/1964 | D'Asaro | 148/187 |
| 3,306,768 | 2/1967 | Peterson | 117/106 |
| 4,002,542 | 1/1977 | Young | 204/38 |
| 4,002,545 | 1/1977 | Fehiner et al. | 204/192 |
| 4,038,167 | 7/1977 | Young | 204/192 |
| 4,371,587 | 2/1983 | Peters | 428/446 |
| 4,474,829 | 10/1984 | Peters | 427/53.1 |
| 4,888,203 | 12/1989 | Rothschild et al. | 427/53.4 |
| 5,017,403 | 5/1991 | Pang et al. | 427/39 |

Primary Examiner—Bernard Pianalto
Attorney, Agent, or Firm—Margaret C. Bogosian

[57] ABSTRACT

A method for producing high quality, thin layer films of inorganic compounds upon the surface of a substrate is disclosed. The method involves condensing a mixture of preselected molecular precursors on the surface of a substrate and subsequently inducing the formation of reactive species using high energy photon or charged particle irradiation. The reactive species react with one another to produce a film of the desired compound upon the surface of the substrate.

12 Claims, 4 Drawing Sheets

METHOD FOR PRODUCING HIGH QUALITY THIN LAYER FILMS ON SUBSTRATES

This invention was made with government support under contract No. DE-AC02-76CH00016, between the US Department of Energy and Associated Universities, Inc. The government has certain rights in the invention.

The present invention relates to methods for producing high quality, thin layer films of inorganic compounds upon the surface of a substrate. In particular, the method involves condensing a mixture of preselected molecular precursors on the surface of a substrate and subsequently inducing the formation of reactive species using high energy photon or charged particle irradiation.

It is often necessary to coat certain substrates with insulating compounds or semiconducting layers, especially in the electronics industry and related fields. Importantly, these layers perform insulating or protective functions as well as imparting certain desired characteristics to the surface of the substrate.

There are a variety of methods currently available for depositing such layers on the surface of substrates. Unfortunately, many of these methods do not provide the artisan with the necessary flexibility needed to apply film layers in a predetermined geometric pattern due to cumbersome apparatus or the like. More importantly, many of these methods are unacceptable because they rely upon process conditions which frequently damage sensitive substrates. For example, several methods rely upon the use of hot gases or plasmas which can damage thermally unstable substrate materials. Other methods involve the formation of particular compounds upon the surface of a substrate wherein the heat of formation released during the chemical reaction damages the substrate.

Accordingly, several methods have been developed which employ a relatively low temperature process for depositing materials upon a substrate. For example, U.S. Pat. No. 4,371,587 to Peters discloses a low temperature process (30° C. or higher) for depositing an oxide layer upon the surface of a desired substrate using reactive vapor deposition in the presence of photochemically generated neutral oxygen atoms. Individual reactant gases are selected in order to form the desired vapor phase compound which is ultimately deposited upon the surface of a substrate. The reactant gases, one of which will contain oxygen, are subsequently contacted with mercury vapor. The mercury atoms are exposed to radiation having a preselected wavelength in order to promote them to an excited state. The excited atoms then collide with the oxygen-containing reactant gas, thereby producing a reactive oxygen species which combines with the remaining gas component to form the desired oxide compound. Unfortunately, the method requires the use of mercury vapor which is extremely hazardous. Furthermore, the resulting film layer is often contaminated to an unacceptable degree.

U.S. Pat. No. 3,306,768 to Peterson discloses the use of a simple hydrolysis reaction for hydrolyzing metal halides into metal oxides upon the surface of a substrate. A corresponding halide of the metal to be deposited is converted into the vapor phase and contacted with an inert carrier gas. The carrier gas transports the vapor phase constituents along with water vapor into a reaction vessel where the reaction mixture is contacted with a substrate having its surface adsorbed with $H_2O$. The adsorbed water hydrolyses the metal halide vapor at the interface between the solid substrate and the gaseous reaction environment, thereby creating the corresponding metal oxide of the metal halide and hydrochloric acid.

The temperature range for this procedure is 20° C. or higher. Consequently, the process is not suitable for surfaces which can be corroded by hydrochloric acid.

In a related approach, U.S. Pat. No. 4,888,232 to Rothschild, et al. discloses a thin film deposition method which entails reacting a vapor of an appropriate metal containing compound with water at or near the substrate surface. In some instances, the reaction can proceed by obtaining the needed moisture directly from ambient air. The deposition process is preferably carried out in a reaction chamber at a temperature between 20° C.-100° C. The resulting film layer deposited by the method described in Rothschild, et al. has low purity because both the initial reactants and the final bi-products are not volatile.

While the aforementioned patents set forth some currently available vapor deposition techniques for producing thin layer films, many other conventional approaches are also available. For example, there are a wide variety of sputtering techniques available wherein a target material composed of the species to be deposited on the substrate is bombarded with electrons or other high energy particles, thereby inducing an excitation of the material. Upon excitation, atoms or molecules of the species to be deposited become dislodged from the target and are subsequently directed toward the substrate and deposited thereon.

As mentioned above, there are many variations in sputtering techniques currently employed in the art. In each of these variations, the particles being deposited upon the substrate surface have a kinetic energy which is a function of their mass and velocity. Consequently, when a particle having a kinetic energy is deposited upon a substrate surface, kinetic energy is transferred to the receiving surface in the form of heat energy known as the latent heat of condensation. If this latent heat of condensation is not properly dissipated, it can promote unwanted chemical reactions at the interface between the deposited material and the substrate material. This phenomenon is especially problematic when attempting to provide a film layer upon a highly sensitive substrate like a compound semiconductor.

One method presently known for minimizing these interfacial reactions involves using cryosorption (adsorption at extremely low temperatures) techniques to condense a layer of inert gas upon a substrate surface prior to deposition of the desired material. In the aforementioned approach, the inert gas serves as a buffer to dissipate the latent heat of condensation, thereby avoiding transfer of kinetic energy to the underlying substrate. Importantly, the inert gas condensed at the substrate surface is not involved in the formation of any reactive species.

Another example of the aforementioned cryosorption-based deposition techniques involves condensing an iron carbonyl film upon the surface of a substrate followed by a subsequent irradiation of the film using "white light" in order to form a thin film of iron upon the substrate surface. P. J. Love, R. R. Loda, R. A. Rosenberg, A. K. Green, V. Rehn. *Proc. of Intern. Soc. for Optical Eng.* 459, 25 (1984). Unfortunately, the resulting iron-based film contains substantial amounts of carbon and oxygen impurities. This result suggests that pure metal deposition may require a more selective molecular excitation with monochromatized light or, alternatively, a specified chemical reaction sequence designed to remove such impurities. As previously mentioned, the presence of impurities often renders the resulting film layer unacceptable for use in many commercial applications.

Additionally, similar cryosorption-based deposition techniques have been combined with sputtering techniques in order to provide a dielectric layer upon a substrate. For example, U.S. Pat. No. 4,002,545 to Fehiner, et al., discloses a method for forming thin film, tantalum oxide, dielectric-containing capacitors by sputtering tantalum oxide in the presence of oxygen under a vacuum at $-70°$ C. A non-tantalum, electrically conductive material which is compatible with tantalum and tantalum oxide is applied to a dielectric substrate such as glass or ceramic. A thin film of tantalum is subsequently layered over the surface of the electrically conductive material. The layered configuration is placed in a typical r-f sputtering apparatus along with a tantalum oxide target substance. An oxygen/inert gas mixture is introduced containing anywhere from 2 to 10% oxygen by volume. After a suitable period of sputtering, a layer of the target material, tantalum oxide, will have been deposited over the tantalum layer. Although the process is designed to minimize the detrimental effects of kinetic energy arising due to particle bombardment of the substrate, the method is unsuitable for many materials and involves all of the complexities associated with sputtering processes.

It is therefore an object of the present invention to provide a new method for producing high quality, thin layer films of a compound upon the surface of a highly sensitive substrate material which does not require conditions that may damage the substrate or undermine the purity of the resulting layer.

Additionally, it is a further object of the present invention to provide a method for producing a high quality, thin layer film of a compound upon a highly sensitive substrate whereby the deposition of material can be manipulated by the artisan in order to "spot coat" the thin film over the surface of the substrate according to a preselected geometric pattern.

SUMMARY OF THE INVENTION

The present invention is a method for producing high quality, thin layer films of inorganic compounds upon the surface of a substrate. The method includes condensing at least a first and a second molecular volatile precursor upon the surface of a substrate under conditions suitable for condensation. Each of the precursors should be capable of rendering a reactive species at the substrate surface upon irradiation. Once the precursors have been condensed upon the substrate, an irradiating beam is directed toward them in order to produce reactive species which correspond to the precursors. These reactive species react with one another to form the desired compound and one or more volatile compounds upon the surface of the substrate.

The method of the present invention is advantageous in that film layers may be deposited upon temperature sensitive substrates without the need for process conditions which may damage the substrate. In the present method, the molecular precursors are condensed at the reaction site, preferably under very low temperature conditions, prior to undergoing any reactivity which would result in the formation of the desired compound upon a substrate. Since the precursors are present in a dense, cold mixture prior to any reaction, they not only react to produce the desired compound, but are capable of buffering the heat of formation generated while the resulting film layer forms during irradiation.

Furthermore, the present method preferably employs volatile precursors and, alternatively, precursors which render a volatile reactive species upon exposure to the irradiating beam. The volatile nature of both precursors or their respective corresponding reactive species is advantageous for ensuring the purity of the resulting film layer. Molecules of the reactive species combine with one another to form the desired film layer which becomes deposited upon the substrate surface or forms volatile bi-products. Unreacted volatile species and bi-products are actively swept away from the developing film layer, thereby avoiding undesirable contamination or can be removed by allowing the film and substrate to warm to room temperature.

Additionally, the present method is advantageous in that it provides the artisan with the ability to "spot coat" thin films over the surface of a substrate according to a preselected geometric pattern. Since the irradiating beam can be precisely focused, it can be directed at particular areas of the substrate in order to "write" geometric patterns thereon. Since exposure of the precursors to the irradiating beam induces the formation of the thin film layer, any areas which do not receive radiation will be rendered free of any film coating. Consequently, the artisan is able to direct placement of the film layer with a high degree of precision, unlike other processes which lack this capability due to cumbersome apparatus or the like.

For a better understanding of the present invention, together with other and further objects, references made to the following description, taken together with the drawings, the scope of which will be pointed out in the appended claims.

DETAILED DESCRIPTION OF THE PREFERRED EMBODIMENTS

Figure 1:
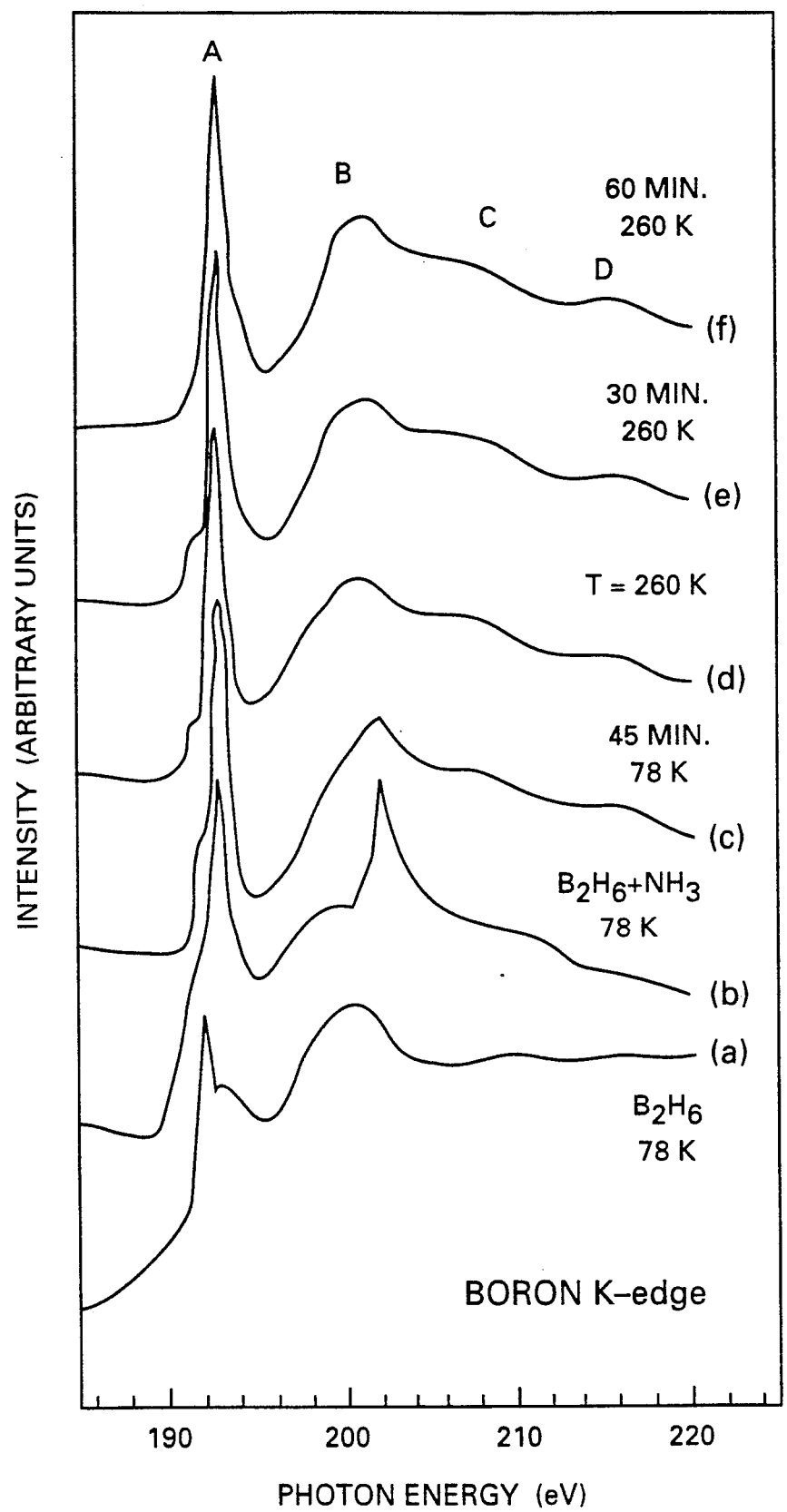
FIG. 1 sets forth the near edge absorption fine structure spectrum (NEXAFS) for solid diborane as well as spectral data corresponding to a developing boron nitride film layer at various time intervals.

As previously mentioned, the present invention is a method for producing a high quality, thin layer film of a specified compound on the surface of a substrate. The method involves condensing at least two different inorganic molecular precursors on the surface of a substrate under conditions suitable for inducing condensation.

It is well-known in the art that certain compounds can be layered over a substrate to provide excellent insulation and/or protection. Moreover, these compounds may also impart certain desirable characteristics to the substrate, such as improved thermal stability. For example, boron nitride (BN), is an ideal candidate for coating some substrates due to its exceptional resistance to chemically reactive groups as well as its high thermal stability. It is a durable, hard material which is an excellent electrical insulator. In its hexagonal form, it has a low coefficient of friction and resembles graphite.

Other compounds similar to boron nitride are known in the art such as, for example, aluminum oxide, diamond-like carbon, boron carbide, aluminum carbide, silicon carbide, silicon nitride, hydrogenated amorphous silicon.

However, problems have arisen in the past when attempting to produce thin films of these materials on sensitive substrates, especially substrates which exhibit low thermal stability.

As previously mentioned, many of the currently available deposition techniques rely upon process conditions such as the use of hot gases or plasmas. These substrates create excessively high temperatures which damage the substrate during the deposition procedure. For example, boron nitride can be grown in a thin film form using the same methods used to deposit a variety of carbides, diamond or nitrites. Most of these techniques use hot substrates or other means to decompose the gaseous precursors, thereby generating the activated species or radicals needed for formation of the film material.

Other methods involve the formation of particular compounds upon the surface of a substrate wherein the heat of formation released during the chemical reaction damages the substrate. Additionally, many of these methods do not provide the artisan with the necessary flexibility needed to apply a film layer in a predetermined geometric pattern due to cumbersome apparatus or the like. The method of the present invention avoids the aforementioned problems by condensing at least two volatile inorganic molecular precursors on the surface of the substrate and subsequently inducing the formation of the resulting film layer by irradiating the precursors with a precisely controlled radiation beam.

For purposes of the present application, "molecular precursors" can be defined as volatile chemical compounds substantially comprised of elements selected from Periodic Groups IIIA, IVA, VA and VIA. In particular, one of the precursors used in the method of the present invention should preferably be a chemical compound formed from elements selected from Periodic Groups VA and VIA. More preferably, the precursor should be a chemical compound formed from elements selected from the group consisting of nitrogen, phosphorus and arsenic. In one of the most preferred embodiments, ammonia ($NH_3$) should serve as the first precursor.

Similarly, the other precursor should preferably be a chemical compound formed from elements selected from Periodic Groups IIIA or IVA. More preferably, this precursor should be a chemical compound formed from elements selected from the group consisting of boron, aluminum and gallium. In one of the most preferred embodiments of the present invention, diborane ($B_2H_6$) should serve as the second precursor.

According to the method of the present invention, the precursors are preferably condensed upon the substrate surface using a method known in the art as cryosorption. This approach involves maintaining the substrate under a vacuum at very low temperatures, thereby providing an effective retention of the precursors upon the substrate surface under high or ultrahigh vacuum conditions. Additionally, maintaining a low temperature promotes the dissipation of undesirable heat resulting from any exothermic heat of formation or latent heat of condensation.

The vacuum should most preferably be maintained at a pressure of, at most, $10^{-5}$ Torr, while the temperature should not exceed 77° K. It is well-known that these temperature and pressure parameters may have to be modified to some degree, depending upon the precursors selected. Such modifications are readily ascertainable by those skilled in the art.

Additionally, each of the precursors should be capable of rendering a volatile reactive species upon exposure to a suitable irradiating beam as set forth below. As previously mentioned, the method of the present invention involves condensing the appropriate precursors on the surface of a substrate. Once condensed, these precursors are exposed to an irradiating beam which should be suitable for an effective excitation of the precursors in order to form their corresponding reactive species.

The irradiating beam should be preferably be either a high energy photon beam, an electron beam, a positron beam, an ion beam or some other charged particle beam which has been effectively modified to promote excitation of the particular precursors selected for condensation. Most preferably, the irradiating beam should be from a vacuum UV source or "white light" synchrotron source.

Upon exposure to the irradiating beam, the precursor molecules undergo an energetic reaction with the photons or charged particles from the beam. This reaction results in the formation of reactive species at sites which have been illuminated by the beam. The resulting reactive species correspond with the precursors that have been condensed upon the substrate surface and react with one another to produce the desired compound at the reaction site.

The irradiating beam can be precisely focused, thereby providing the artisan with the ability to induce formation of the desired compound at precise locations upon the substrate surface. Consequently, the artisan is afforded the ability to "spot coat" high quality films upon the surface of a substrate according to a preselected geometric pattern.

Additionally, the condensation of the precursor molecules upon the substrate surface creates a highly dense reaction mixture at the reaction site. The resulting density of the reaction mixture facilitates the growth of the desired compound upon the substrate surface while minimizing any impurities. Importantly, the precursors should preferably be in a gaseous form prior to undergoing irradiation or, alternatively, render a volatile reactive species upon exposure to the irradiating beam. The volatile nature of either the precursors or their respective corresponding reactive species is advantageous for ensuring the purity of the resulting film layer. Molecules of the reactive species which combine with one another to form the desired film layer become deposited upon the substrate surface. Unreacted volatile species are actively swept away from the developing film layer.

Additionally, the method of the present invention is advantageous because the condensed precursors not only combine to form the desired film layer, but also function to buffer any latent heat of condensation or heats of formation occurring during the reaction process.

In accordance with the method of the present invention, the following Example is provided so as to promote a better understanding of the method and the film coated substrate resulting therefrom. Accordingly, the Example is merely illustrative of the present method and is not intended to limit or restrict in any way the true scope of the invention.

EXAMPLE

A boron nitride (BN) thin film layer was formed upon a substrate material according to the following procedure. Diborane ($B_2H_6$) and ammonia ($NH_3$) precursors were condensed onto a silver (Ag) coated copper plate held at a temperature of 78° K. until a layer of the reaction mixture reached a thickness of about 10–20 Angstroms. The diborane precursor was a commercially available semiconductor grade of a 5% $B_2H_6$/95% argon gas mixture. Upon introduction into the reaction chamber, the diborane/argon mixture was analyzed using a mass spectrometer and the characteristic diborane cracking pattern was observed.

The procedure was performed in a ultra-high vacuum chamber of standard design and consisted of a non-magnetic stainless steel vacuum enclosure equipped with a turbo-molecular pump, a cryopump and an ion pump. The system was adjusted to maintain to a vacuum of better than $1 \times 10^{-9}$ Torr during the experiment however, a vacuum of at least $1 \times 10^{-5}$ Torr would be acceptable.

After introduction of the diborane/argon mixture into the chamber and the completion of the gas analysis, ammonia ($NH_3$) was subsequently added. After additional spectrophotometric readings were obtained, the gaseous reaction mixture was irradiated using a "white light" irradiating beam from a synchrotron source.

Additional spectrophotometric data were taken after 45 minutes of radiation, while holding the temperature at 78° K. Only the regions exposed to the synchrotron radiation displayed the formation of a boron nitride (BN) layer.

The chamber was warmed to a temperature of 260° K. in order to remove volatile unreacted species, thereby leaving behind a non-volatile reaction product, the boron nitride film. At 30 and 60 minute intervals after the temperature reached 260° K., additional white beam energy was administered to the sample in order to test its stability. It was found that the initially formed boron nitrate film was substantially amorphous. After the additional white beam energy was administered the boron nitrate film became substantially crystalline.

CONCLUSIONS AND SUMMARY OF DATA

FIG. 1 illustrates the formation of boron nitride. The bottom curve (a) shows the near edge absorption fine structure (NEXAFS) spectrum of solid diborane. Since the data is in disagreement with earlier gas phase results as set forth by Zimkina and Vinogradov, (see T. M. Zimkina and A. S. Vinogradov, Bull. Acad. Sci. (USSR) Phys. Ser. 36, 229, 1972), the gas mixture was analyzed with a mass spectrometer and the characteristic diborane cracking pattern was observed. It is possible that the solid state spectrum for condensed diborane differs from the gas phase due to interactions between the diborane molecules in the solid. Such interactions have been reported for solid NO by Tonner, et al. See B. P. Tonner, C. M. Kao, E. W. Plummer, T. C. Caves, R. P. Messmer and W. R. Salaneck, Phys. Rev. Lett. 51, 1378 (1983). Due to this uncertainty, the boron-containing reactant will be hereinafter referred to as a boron hydride.

Curve (b) in FIG. 1 illustrates an interaction or reaction between the boron hydride and ammonia when condensed at 78° K. The feature associated with transitions from the boron is level to unoccupied levels in the boron hydride decreases and a feature (Peak A) appears at about 0.75 eV photon energy above it. The rapid decrease of this initial feature with the addition of ammonia is probably due to the breaking of protonated bridge bonds in the boron hydride. The residual peak at low photon energy is probably due to some remaining diborane or other hydrogen containing intermediates. Diborane and ammonia can react at 78° K. to form the complex $(NH_3)_2BH_2BH_4$ which results from the asymmetric cleavage of the bridging bonds in the boron hydride. This may be an essential precursor for boron nitride formation because heating of this complex to 800° K. can cause it to breakup into volatile components like hydrogen and $H_2BNH_2$. Another sharp feature is observed at 200 eV when $NH_3$ is added. This feature is the second order spectrum of nitrogen from ammonia which appears at 400 eV in first order.

Curve (c) illustrates the NEXAFS data for a mixture of diborane and ammonia after an irradiation for 45 minutes. Curve (d) is produced by a nonvolatile film of boron nitride. Curves (e) and (f) provide the NEXAFS data for that film irradiated for 30 and 60 minutes, respectively.

Figure 2:
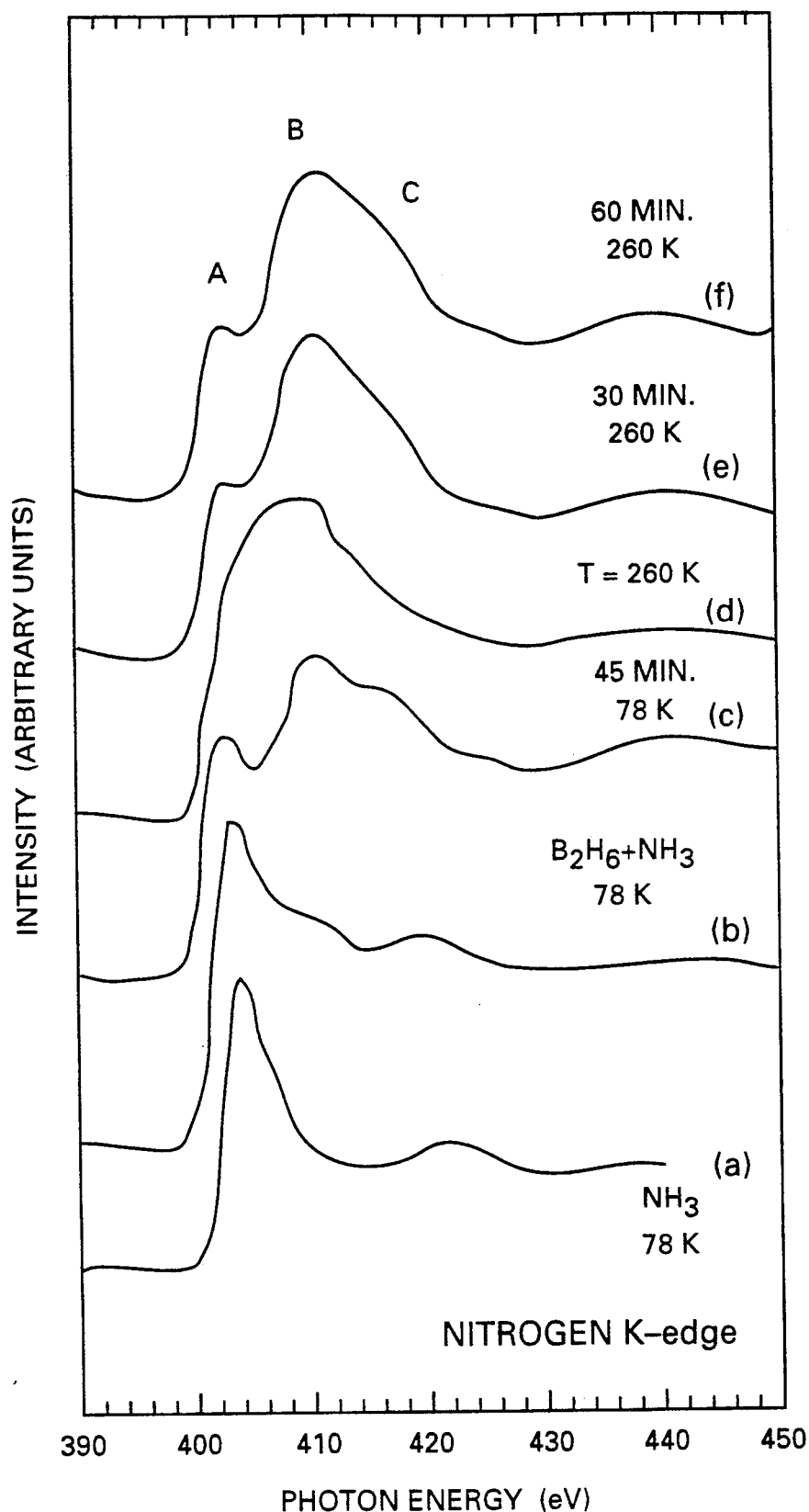
FIG. 2 sets forth the nitrogen K-edge (1st order) for solid $NH_3$ as well as spectral data corresponding to the developing boron nitride film layer according to the same time intervals shown in FIG. 1.

FIG. 2 shows that corresponding changes are also seen at the nitrogen near-edge after $NH_3$ is mixed with diborane. The strong ammonia NEXAFS feature associated with transitions from the nitrogen is level to Rydberg states become measurably weaker. A new near-edge feature is seen near 410 eV. The $NH_3$ shape resonance becomes smaller and shifts to lower photon energy and is not found at 418 eV. The weakening of the nitrogen K-edge features and the shift of the shape resonance indicate bonding between ammonia and the borane.

Figure 3:
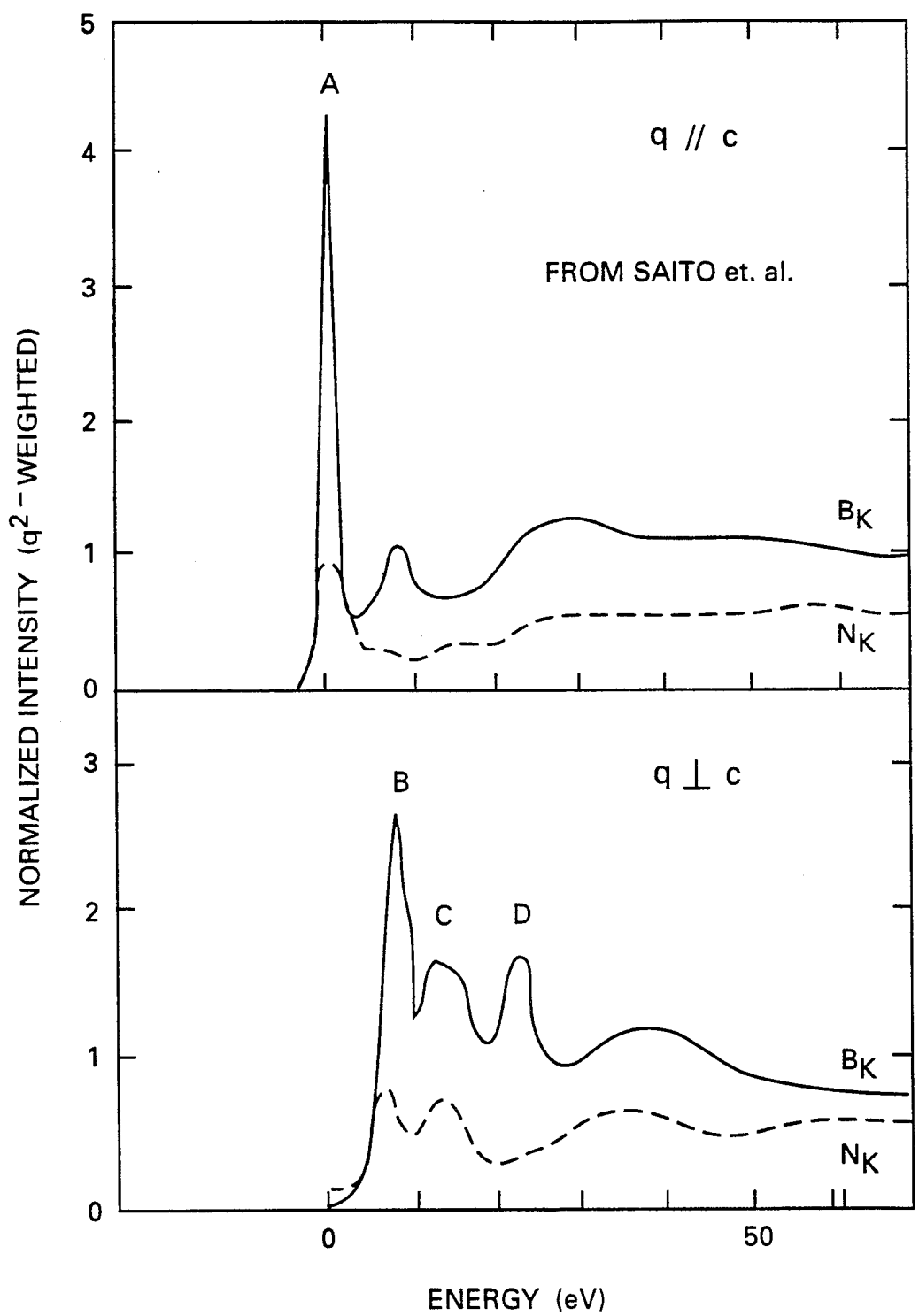
FIG. 3 sets forth boron and nitrogen K-edge EELS data for hexagonal boron nitride.

Exposure to the white light synchrotron beam causes a significant modification in the boron hydride-ammonia mixture. Changes are evident at both the boron and nitrogen K-edges shown in FIGS. 1 and 2. FIG. 1 exhibits a sharpening of the feature associated with B-N bonding or boron nitride and a great reduction of the features below 192 eV which are identified with remaining B-H compounds. There is also a great reduction of the second order ammonia feature, as expected. Most significant are the reduction of states in the 195 eV region and the growth of features at about 200, 206, and 216 eV. All of the NEXAFS features are characteristic of hexagonal boron nitride (h-BN). A representative boron K-edge electron energy loss spectrum included herein was obtained from the work of Saito, et al. See S. Saito, K. Higeta and T. Ichinokawa, J. Microsc. 142, 141 (1985). The spectrum is reproduced and shown in FIG. 3. The agreement in the number and spacing of peaks is immediately evident. The features shown in FIG. 1 are somewhat smeared out as expected in a highly disordered system. FIG. 2 also shows the great changes that take place at the nitrogen K-edge as well as features observed at ~403, 410, 416 and 440 eV which are characteristic of h-BN. (See FIG. 3).

Warming the reaction chamber to 260° K. removes any volatile species and leaves behind non-volatile reaction products, particularly boron nitride. FIG. 1 shows that the feature below 192 eV almost disappeared. This appears to correlate with the evaporation of volatile boron hydrides and species such as $(NH_3)_2BH_2BH_4$. It is also evident from the weakening of the nitrogen K-edge in second order that the concentration of volatile nitrogen compounds is also reduced. The nitrogen edge shown in FIG. 2 indicates that there is an appreciable amount of smearing of the NEXAFS features. It is possible that this is due to some remaining ammonia that has migrated to the surface. Another interpretation is that the removal of volatile species produces a highly disordered solid with a large number of vacancies and broken bonds. Upon re-exposure to "white light", all the nitrogen K-edge features are sharpened and curves characteristic of hexagonal boron nitride appear, as can be seen from a comparison with FIG. 3.

Figure 4:
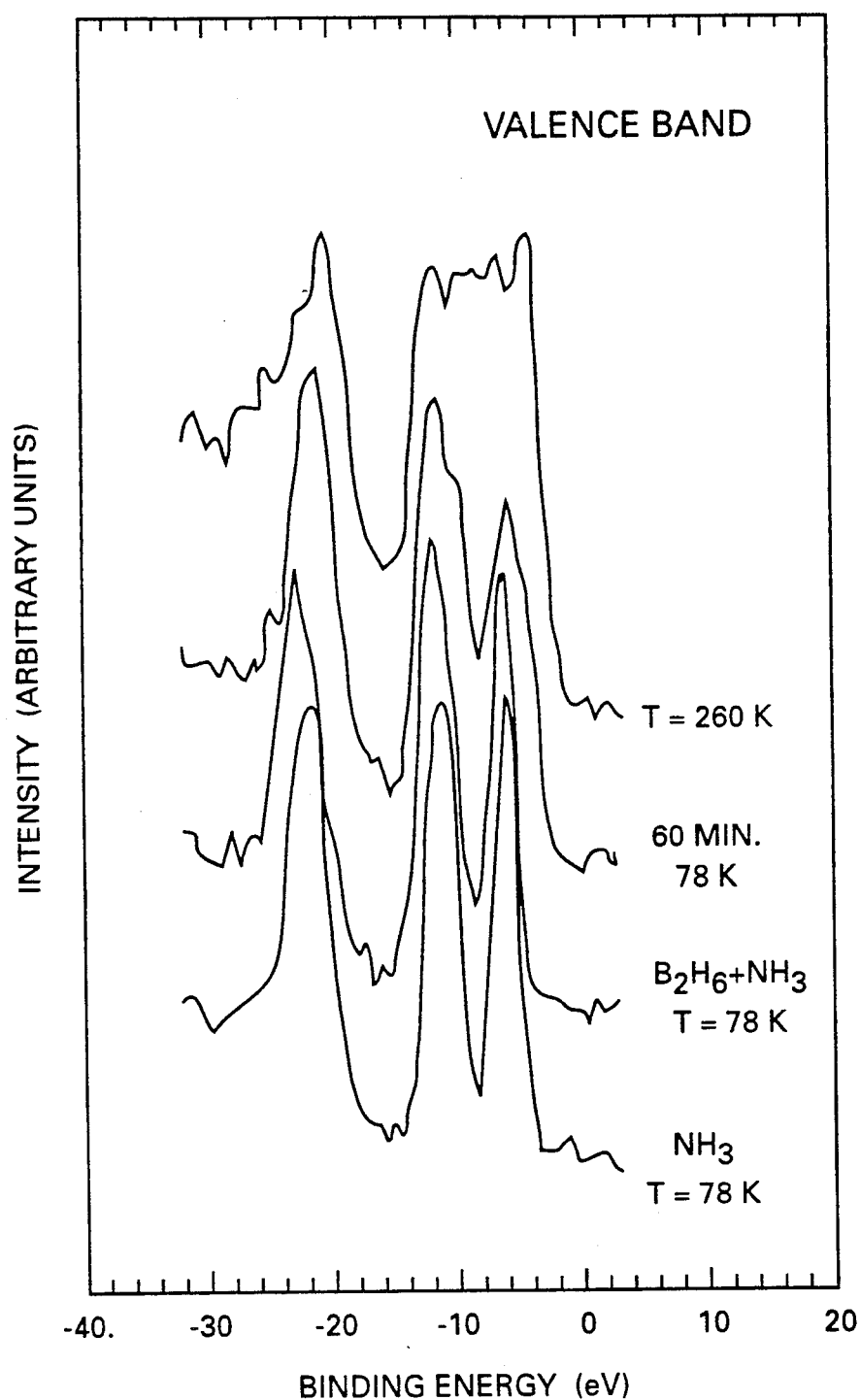
FIG. 4 sets forth the valence band spectra corresponding to boron and nitrogen K-edge data.

Valence band photoemission spectra also suggest that synchrotron radiation causes the formation of boron nitride from a diborane/ammonia mixture. The photoemission energy dispersion curve (EDC) for the diborane mixture has strong photoemission features that resemble those of solid ammonia. The intensity of the diborane and ammonia features for the respective solids is comparable at 150 eV photon energy and this suggests that $NH_3$ either preferentially condenses on the substrate or separates from the mixture and segregates to the surface. Synchrotron irradiation causes a broadening of the $NH_3$ related features, or the appearance of new states between 3 and 12 eV. The peak at $-23$ eV, associated with the $NH_3$ $2a_1$ level, moves about 2 eV to a lower binding energy. FIG. 4 sets forth the valence band photoemission spectra corresponding to the boron and nitrogen K-edge data.

Furthermore, after warming the chamber to 260° K. in order to remove any remaining volatile species, it becomes clear that exposure to synchrotron light produces the features at 10 eV and 20 eV below the Ag Fermi level. Such features are characteristic of boron nitride. In addition, the material shows a band gap which would be expected for an insulator. A peak appearing at about 4eV below the Ag Fermi level reference could be present due to boron nitride or due to the Ag 4d states showing through the boron nitride layer.

While there have been described herein what are presently believed to be the preferred embodiments of the present invention, those skilled in the art will realize that changes and modifications may be made thereto without departing from the spirit of the invention, and it is intended to claim all such changes and modifications as fall within the true scope of the invention.

We claim:

1. A method for selectively providing a highly pure, thin layer film of a compound on the surface of a temperature sensitive substrate, said method comprising:

condensing at least a first and a second molecular precursor on the surface of said substrate under cryosorption conditions suitable for condensation, each of said precursors being capable of rendering volatile reactive species at the substrate surface upon irradiation; and directing an irradiating beam at said precursors under conditions suitable for formation of at least a first and a second reactive species corresponding to said first and second precursors, respectively, whereby said first and second species react to form said compound upon the surface of said substrate.

2. A method according to claim 1, further comprising selecting said irradiating beam from the group consisting of high energy photon beams, electron beams, positron beams, ion beams and modified charged particle beams.

3. A method according to claim 2, further comprising providing said beam from a synchrotron radiation source.

4. A method according to claim 1, further comprising condensing said precursors upon said substrate under a vacuum.

5. A method according to claim 4, further comprising providing said vacuum at a pressure of, at most, equal to $10^{-5}$ Torr.

6. A method according to claim 1, further comprising condensing said precursors upon said substrate at a temperature of at most, equal to about 77° K.

7. A method according to claim 1, further comprising providing said first precursor in the form of a first compound formed from elements selected from the group consisting of Periodic Groups IIIA and IVA.

8. A method according to claim 7, further comprising providing said second precursor in the form of a second compound formed from elements selected from the group consisting of Periodic Groups VA and VIA.

9. A method according to claim 8, further comprising providing said second compound from elements selected from the group consisting of nitrogen, phosphorus, arsenium, oxygen and sulfur.

10. A method according to claim 9, further comprising providing diborane to serve as said first precursor.

11. A method according to claim 7, further comprising providing said first compound from elements selected from the group consisting of boron, aluminum, gallium, indium, carbon, silicon and germanium.

12. A method according to claim 7, further comprising providing ammonia to serve as said second precursor.

* * * * *